(12) United States Patent
Lim

(10) Patent No.: US 7,777,568 B2
(45) Date of Patent: Aug. 17, 2010

(54) HIGH FREQUENCY RECEIVER PREAMPLIFIER WITH CMOS RAIL-TO-RAIL CAPABILITY

(75) Inventor: Hong Sair Lim, Singapore (SG)

(73) Assignee: Mandate Chips and Circuits Pvt. Ltd., Singapore (SG)

( * ) Notice: Subject to any disclaimer, the term of this patent is extended or adjusted under 35 U.S.C. 154(b) by 824 days.

(21) Appl. No.: 11/002,616

(22) Filed: Dec. 2, 2004

(65) Prior Publication Data
US 2006/0119429 A1 Jun. 8, 2006

(51) Int. Cl.
*H03F 3/18* (2006.01)
(52) U.S. Cl. .................. 330/253; 330/255; 330/311
(58) Field of Classification Search .......... 330/253, 330/255, 311
See application file for complete search history.

(56) References Cited

U.S. PATENT DOCUMENTS

| | | | | |
|---|---|---|---|---|
| 4,555,673 A | | 11/1985 | Huijsing et al. .............. 330/258 |
| 5,179,354 A | * | 1/1993 | Okamoto .................... 330/253 |
| 5,208,552 A | | 5/1993 | Ryat ......................... 330/253 |
| 5,323,120 A | | 6/1994 | Ryat ......................... 330/252 |
| 5,334,948 A | | 8/1994 | Fong et al. ................. 330/253 |
| 5,371,474 A | | 12/1994 | Wassenaar et al. .......... 330/253 |
| 5,384,548 A | | 1/1995 | Sakurai et al. .............. 330/253 |
| 5,574,401 A | | 11/1996 | Spitalny ..................... 330/253 |
| 5,631,607 A | | 5/1997 | Huijsing et al. .............. 330/253 |
| 5,646,575 A | | 7/1997 | Sauer ......................... 330/261 |
| 5,920,810 A | * | 7/1999 | Finol et al. .................. 455/313 |
| 6,380,801 B1 | * | 4/2002 | McCartney ................... 330/9 |
| 6,384,683 B1 | | 5/2002 | Lin ............................ 330/257 |
| 6,605,964 B2 | * | 8/2003 | Nakada ....................... 327/65 |
| 6,642,788 B1 | * | 11/2003 | Abughazaleh .............. 330/253 |
| 2006/0119429 A1 | * | 6/2006 | Lim ........................... 330/253 |

OTHER PUBLICATIONS

"A Compact Power-Efficient 3V CMOS Rail-to-Rail Input/Output Operational Amplifier for VLSI Cell Libraries", by Hogervorst et al., IEEE Jrnl. of Solid-State Cir., vol. 29, No. 12, Dec. 1994, pp. 1505-1513.

(Continued)

*Primary Examiner*—Michael B Shingleton
(74) *Attorney, Agent, or Firm*—Saile Ackerman LLC; Stephen B. Ackerman

(57) ABSTRACT

A folded cascode receiver amplifier with constant gain has inputs coupled to PMOS and NMOS differential transistors pairs with scaled geometries. The transconductance of both PMOS and NMOS transistors is the same whether the common mode input voltage is low or high. In a first version the transconductance of both PMOS and NMOS differential transistor pairs is reduced when the common mode input voltage is at mid-rail. Resistive means between current sources and the sources of the PMOS and NMOS transistor pairs force the current source transistors into the triode region of operation. A second version insures a constant voltage gain through control means which maintain a constant ratio of the transconductance of the output stage transistors versus the PMOS and NMOS differential transistor pairs when active.

23 Claims, 6 Drawing Sheets

OTHER PUBLICATIONS

"A High Bandwidth Constant gm and Slew-Rate Rail-to-Rail CMOS Input Circuit and its Application to Analog Cells for Low Voltage VLSI Systems", by William Redman-White, IEEE Jrnl. of Solid-State Circuits, vol. 32, No. 5, May 1997, pp. 701-712.

"Robust Design of Rail-to-Rail CMOS Operational Amplifiers for on Low Power Supply Voltage", by Sakwrai et al., IEEE Jrnl. of Solid-State Cir., vol. 31, No. 2, Feb. 1996, pp. 146-156.

"Constant-gm Rail-to-Rail CMOS Dp-Amp Input Stage with Overlapped Transition Regions," by Minsheng Wang et al., IEEE Jrnl. of Solid-State Cir., vol. 34, No. 1, Feb. 1999, pp. 148-156.

"CMOS Low-Voltage Operational Amplfiiers with Constant-Gm Rail-to-Rail Input Stage," by Hogervorst et al., 0-7803-0593-0/92, 1992 IEEE, pp. 2876-2879.

\* cited by examiner

FIG. 1 - Prior Art

```
┌─────────────────────────────────────────────┐
│ Providing an open-loop differential preamplifier where │
│ PMOS and NMOS input transistor pairs are scaled to     │──1
│ have the same transconductance                         │
└─────────────────────────────────────────────┘
                      ↓
┌─────────────────────────────────────────────┐
│ Inserting resistive means into the tail current paths  │
│ of each of the PMOS and NMOS input transistor pairs,   │
│ between their sources and the transistor drains        │
│ of their respective current sources, thereby           │──2
│ forcing current sources in their tail current          │
│ paths into the triode region of operation              │
└─────────────────────────────────────────────┘
                      ↓
┌─────────────────────────────────────────────┐
│ Reducing thereby the total transconductance of both    │
│ the PMOS and NMOS input transistor pairs, when active, │──3
│ to that of one active input transistor pair            │
└─────────────────────────────────────────────┘
                      ↓
┌─────────────────────────────────────────────┐
│ Keeping thereby the transconductance of the open-loop  │
│ differential preamplifier constant, regardless of the  │──4
│ common mode input voltage                              │
└─────────────────────────────────────────────┘
                      ↓
┌─────────────────────────────────────────────┐
│ Coupling current summing outputs to the drains         │──5
│ of the PMOS and NMOS transistor pair                   │
└─────────────────────────────────────────────┘
```

*FIG. 4*

HIGH FREQUENCY RECEIVER PREAMPLIFIER WITH CMOS RAIL-TO-RAIL CAPABILITY

BACKGROUND OF THE INVENTION

1. Field of the Invention

The invention relates to a low voltage differential signal receiver, and more particularly to a receiver which has a constant voltage gain over a large input common mode voltage range.

2. Description of the Related Art

Because of the large common mode input range (0.2 v to 2.2 v) that a preamplifier for a Low Voltage Differential Signal (LVDS) receiver uses, the CMOS rail-to-rail input stages of the preamplifier comprise an NMOS differential pair connected in parallel with a PMOS differential pair. The NMOS input pair is able to reach the positive supply rail while the PMOS input pair is able to reach the negative supply rail. At the middle of the common mode voltage range, both the NMOS and PMOS input pairs are on, and the total transconductance gm has twice the gm of a single pair, assuming both pairs have the same gm value. Because of this, the total transconductance is not constant across the input common-mode range. This is an undesired phenomenon because it results in non-constant gain and variable unity gain bandwidth.

Below are the typical specifications of a Low Voltage Differential Signal (LVDS) receiver that the preamplifier needs to support:

LVDS Receiver Preamplifier Specifications:

| | Features | | | | |
|---|---|---|---|---|---|
| frequency | 175 MHz to 945 MHz | | | | |
| | DC Specifications | | | | |
| Symbol | Parameters | Condition | Min | Typ | Max Unit |
| VTH | Differential Input High Threshold | VOC = +1.2 V | | | +100 mV |
| VTL | Differential Input Low Threshold | | −100 | | mV |
| Vid | Input differential voltage | Rin = 100 ohm | 0.1 | | 0.4 V |
| Iin | Input current | Vin = +2.4/0 V Vcc = 3.6 V | | | ±10 µA |
| Voc | Common Mode Voltage | | 0.2 | 1.2 | 2.2 V |

All known prior art has attempted to solve the above mentioned problem of non-constant gm over the entire common mode input range. This is due to the application of the rail-to-rail input stage in Operational Amplifier design where large variation of gm impedes an optimal frequency compensation.

Referring now to FIG. 1, which was taken from the second reference listed below (W. Redman-White), we describe a typical circuit of the prior art. Rail-to-Rail input stages utilizing NMOS (M1, M2) and PMOS (M3, M4) differential pairs in parallel and joined by a Current Summation block, have three operating regions with respect to the Input common mode voltage range. When the common mode Input voltage is near the negative power supply ($V_{SS}$), only the PMOS pair operates. For common mode Input voltages near the positive power Supply ($V_{DD}$), only the NMOS pair operates. For common mode Input voltages around mid-rail, both differential pairs operate and in this region, the transconductance of the input stage is twice as big as in the regions where only one pair (PMOS or NMOS) is on. The basic principle behind this is to vary the effective tail current in the active differential pair so that its gm doubles when the other is inactive. A simple way to achieve this is to use a transistor to sense that one of the pairs has lost current through a bypass transistor. Please refer to paper:

R. Hogervorst, J. P. Tero, R. G. H. Eschauzier, and J. H. Huising, "A Compact Power-Efficient 3V CMOS Rail-to-Rail Input/Output Operational Amplifier for VLSI Cell Libraries," IEEE Journal of Solid State Circuits, Vol. 29, No. 12, pp. 1505-1513, December 1994, which describes a two-stage, compact, power-efficient 3V CMOS operational amplifier with rail-to-rail input and output ranges.

An alternative technique is to increase the tail current bias on each side by a factor of 4 and to add additional devices inside each differential pair, which have a width 3 times that of the active devices. If the square-law operation is valid, gm will double, making up the deficit caused by the inactive pair, refer to below cited U.S. Pat. No. 5,208,552. In these implementations, the diverting transistor is 3 times wider than the driving transistor, which causes extra tail current added to the large signal limiting value. Hence slewing value doubles within the common input voltage range. To remedy this, a novel implementation that employs a diverting transistor of the same size as that of the driving transistor have been reported in W. Redman-White, "A High Bandwidth Constant gm and Slew-Rate Rail-to-Rail CMOS Input Circuit and its Application to Analog Cells for Low Voltage VLSI Systems," in IEEE Journal of Solid State Circuits, Vol. 32, No. 5, pp 701-712, May 1997, which describes a new rail-to-rail CMOS input architecture that allows circuit behavior which is nearly independent of the common mode level with respect to transconductance and slewing characteristics.

Other approaches include:

a) controlling the sum total $V_{GS}-V_T$ in the two pairs by current steering, and hence regulating the total gm, as referred to in S. Sakurai and M. Ismail, "Robust Design of Rail-to-Rail CMOS Operational Amplifiers for a Low Power Supply Voltage," IEEE Journal of Solid State Circuits, Vol. 31, No. 2, pp. 146-156, February 1996, which describes new bias circuits which provide currents to n- and p-channel differential pairs placed in parallel. The bias currents are a function of the input common mode voltage to allow the total transconductance of the differential pairs to be constant over the entire common mode range.

b) overlapping the transition regions of the tail currents for the NMOS and PMOS pairs to achieve constant overall transconductance gm, as referred to in M. Wang, T. L. Mayhugh, S. H. K. Embabi, E. Sanchez-Sinencio, "Constant-gm Rail-to-Rail CMOS Op-Amp Input Stage with Overlapped Transition Regions," IEEE Journal of Solid State Circuits, Vol. 34, No. 2, pp. 148-156, February 1999, which describes a design technique to maintain a constant gm input stage. The proposed technique overlaps the transition regions of the tail currents for the n- and p-pairs to achieve constant overall transconductance gm.

U.S. Patents that relate to the present invention disclosure are:

U.S. Pat. No. 4,555,673 (Huijsing et al.) discloses a differential amplifier containing a pair of differential portions and a summing circuit with rail-to-rail input capability and controlled transconductance. A current control regulates the operating currents for the differential portions.

U.S. Pat. No. 5,208,552 (Ryat) teaches the use of a rail-to-rail operational transconductance amplifier having a first operating range where the two differential amplifiers are active and second and third operating ranges where only one differential amplifier is active. Means are provided such that the transconductance of the active transistors in one of the second or third ranges is equal to twice the transconductance of the transistors in the first range.

U.S. Pat. No. 5,323,120 (Ryat) shows an Operational Transconductance Amplifier (OTA) with complimentary input transistor pairs where a dummy diode is provided for each pair. When the common mode input signal is near the positive or negative supply voltage, one of the pairs turns off. The diode loads act to increase the current through the other pair when this occurs. This results in a constant transconductance over the entire common mode input range.

U.S. Pat. No. 5,334,948 (Fong et al.) describes a CMOS constant operational amplifier which has two differential input circuits each having a current source and a compensation circuit. Each compensation circuit dynamically tracks the common mode input voltage relative to a respective supply voltage and generates a respective tracking voltage that is used to modulate the current source of the respective differential input circuit. The operational amplifier maintains virtually constant open loop gain throughout its entire operating range.

U.S. Pat. No. 5,371,474 (Wassenaar et al.) shows differential amplifier similar to U.S. Pat. No. 4,555,673 described above, but uses FETs and allows square-root current control.

U.S. Pat. No. 5,384,548 (Sakurai et al.) presents rail-to-rail operation by placing NMOS and PMOS transistors in parallel so that at least one type of transistors are operating in a high gain region throughout the entire input range. A constant transconductance bias means enables the rail-to-rail CMOS differential stage to possess a constant transconductance over the entire common mode voltage range.

U.S. Pat. No. 5,574,401 (Spitalny) discloses a CMOS amplifier input stage comprising NMOS and PMOS differential pairs connected in parallel. The tail currents of these differential pairs are controlled to maintain a nearly constant effective total transconductance, i.e., the combined transconductances of both pairs remain at least approximately constant as the input voltage swings through its operating range.

U.S. Pat. No. 5,631,607 (Huijsing et al.) teaches compact gm control circuits which makes constant the sum of the gate-source voltages of the complementary input transistors and thereby the gm of the input stage. The circuit implements a floating voltage source between the N and P-channel input stage transistors and the positive and negative voltage supply rails.

U.S. Pat. No. 5,646,575 (Sauer) describes a composite amplifier which is constructed by connecting the corresponding input terminals of a high-frequency amplifier and a precision amplifier together. Also the output of the precision amplifier is connected to the offset trim port of the high-frequency amplifier.

U.S. Pat. No. 6,384,683 (Lin) describes an intermediate stage for a rail-to-rail input/output CMOS operational amplifier. It includes a floating current source separating two current mirrors, where the ideal current source includes a floating current mirror enabling an output quiescent current to be provided which does riot vary with changes in the voltage rails or the common-mode input voltage. This enables elimination of input offset caused by the mismatch of the two current sources.

Most of the above U.S. Patents describe methods to achieve constant transconductance bias to enable the rail-to-rail CMOS differential stage to possess a constant transconductance over the entire common mode voltage range.

Related art techniques to provide constant gm bias for rail-to-rail input stage require extra current consumption; either through the use of current monitor/control circuits or by level shifting. In the LVDS receiver applications where the input stage has to work up to 945 MHz, current consumption of the input stage is very high and any current monitor/control would consume a considerable amount of current.

Besides that, having a constant gm at the input stage does not mean that the voltage gain will be constant. If this input stage drives a load Rout, then the voltage gain will be gm*Rout, which will vary by at least +/−10% if Rout is an integrated resistor.

In contrast, the present invention maintains a constant voltage gain over a large input common mode voltage range and at the same time is power efficient.

SUMMARY OF THE INVENTION

It is an object of at least one embodiment of the present invention to provide circuits and methods to maintain a constant voltage gain over a large input common mode voltage range.

It is another object of the present invention to provide circuits which are power efficient.

It is yet another object of the present invention to provide circuits where the voltage gain is determined by the transconductance of whichever PMOS or NMOS differential transistor pair that is active.

It is still another object of the present invention to ensure that the nominal transconductance values of PMOS and NMOS differential transistor are the same.

It is a further object of the present invention is to insure that the overall transconductance remains the same when both PMOS and NMOS differential transistor pairs are active compared to when only one of the PMOS or NMOS differential transistor pairs is active.

It is yet a further object of the present invention is to insure a constant ratio of the transconductance of the PMOS and NMOS differential transistor pairs versus the transconductance of the output stage transistors.

These and many other objects have been achieved by PMOS and NMOS transistors with scaled geometries so that the transconductance of both PMOS and NMOS transistors is the same and where the transconductances of both PMOS and NMOS differential transistor pairs are reduced when both are active. In a first preferred embodiment of the present invention resistive means are coupled between current sources and the sources of PMOS and NMOS transistor pairs, respectively, to force the current source transistors into the triode region of operation. The second preferred embodiment of the present invention ensures a constant ratio of the transconductance of the PMOS and NMOS differential transistor pairs versus the transconductance of the output stage transistors by control circuits which sense the common mode input voltage and adjust the transconductance of output stage transistors. Two such control circuits are used, one for sensing when the common mode input voltage is low and one when the common mode input voltage is high. When the common mode input voltage is low diode-connected PMOS transistors are activated for each positive and negative output stage. When the common mode input voltage is high diode-connected NMOS transistors are activated for each positive and negative output stage. When the common mode input voltage is at mid-rail, between low and high, both diode-connected PMOS and NMOS transistors are activated for each positive and negative output stage. In a third preferred embodiment of the present invention resistive means are coupled between the sources of the PMOS and NMOS transistor pairs, respectively, to improve the linearity of the transconductance of those transistor pairs.

These and many other objects and advantages of the present invention will be readily apparent to one skilled in the art to which the invention pertains from a perusal of the claims, the appended drawings, and the following detailed description of the preferred embodiments.

BRIEF DESCRIPTION OF THE DRAWINGS

FIG. 4 is a block diagram of the method of the first embodiment of the invention.

Use of the same reference number in different figures indicates similar or like elements.

DESCRIPTION OF THE PREFERRED EMBODIMENT

All of the above-mentioned Rail-to-Rail input stages attempt to maintain a constant gm over a large input common mode voltage range in applications in Operational Amplifiers which operate in closed-loop with feedback. This prohibits high frequency operation at 945 MHz with current CMOS technologies. Thus, Low Voltage Differential Signal (LVDS) receivers utilize a preamplifier that operates in open-loop for high speed operation. As such, there is no requirement for frequency compensation which is made difficult by the varying unity gain bandwidth caused by the varying transconductance of the input stage. However, it is of utmost important for the preamplifier to have very constant voltage gain to amplify the differential input signal with amplitudes in the range of 0.1V to 0.4V. If the voltage gain is not constant over the Process, Supply Voltage, Temperature (PVT) corners, not only will there be a huge difference in the amount of tail current or gm required to provide a certain voltage gain over the PVT corners. The big difference in the preamplifier output voltage amplitude also results in a varying output slew rate. Hence the present invention aims to maintain a constant voltage gain over a large input common mode voltage range. The circuit techniques applied to achieve this are not seen in any prior art.

Figure 1:
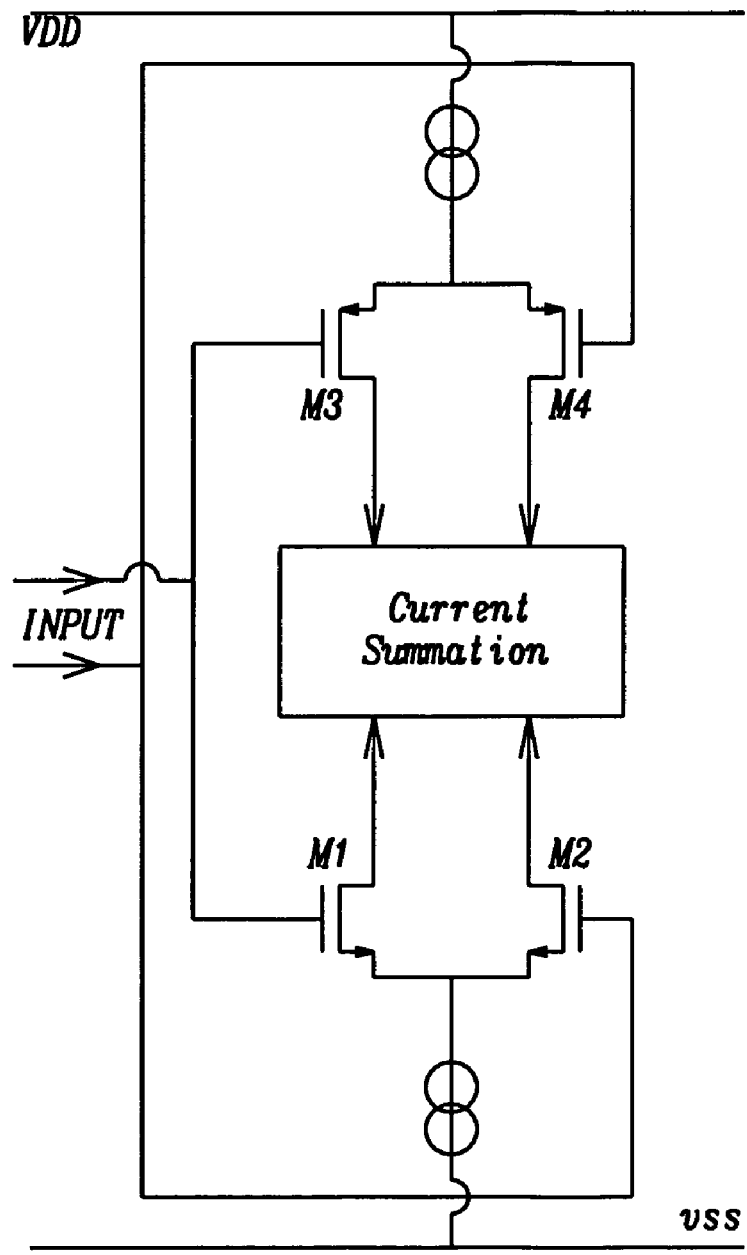
FIG. 1 is a block diagram of a simple rail-to-rail architecture with p and n-channel differential pairs of the prior art.
Figure 2:
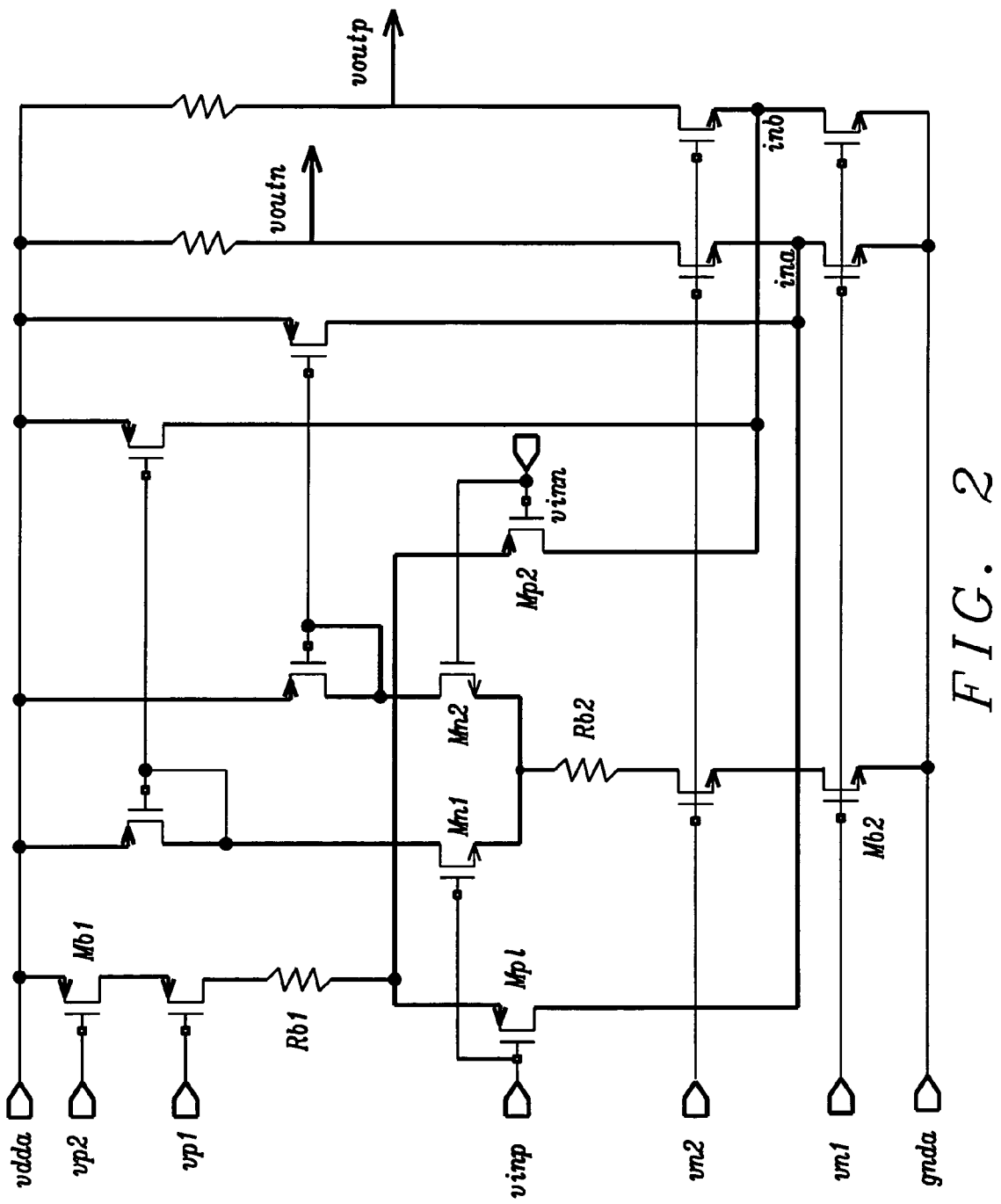
FIG. 2 is a circuit diagram of an LVDS Receiver preamplifier of a first preferred embodiment of the present invention.

FIG. 2 shows the embodiment of a first preferred implementation of an LVDS Receiver Preamplifier. It can be easily recognized by those skilled in the art as a preamplifier based on the folded cascode architecture for high frequency operation. The current summation of the PMOS (Mp1, Mp2) and NMOS (Mn1, Mn2) pairs is done at node ina and node inb. Inputs vinp and vinn connect to the gates of transistors Mp1 and Mp2, respectively. The outputs of the output stage are voutp and voutn. Other inputs to FIG. 2 are vdda, (the positive rail or positive terminal of a power supply), gnda (the negative rail or negative terminal of a power supply), and biasing inputs vp1, vp2, vn1, and vn2.

Since there are 3 regions of operation for the input stage, there are 3 different regions for $gm_T$ which is given in strong inversion by:

$$gm_T = gm_{ninput} + gm_{pinput}$$
$$= \sqrt{2\mu_p C_{ox}(W_p/L_p) I_p} + \sqrt{2\mu_n C_{ox}(W_n/L_n) I_n}$$

where $\mu_p$ is the average mobility of the holes in the channel of PMOS devices (Mp1, Mp2) and $\mu_n$ is the average mobility of the electrons in the channel of NMOS devices (Mn1, Mn2); Cox is the capacitance per unit area of the gate oxide; (Wp/Lp) is the effective channel width divided by the effective channel length of the PMOS devices (Mp1, Mp2); (Wn/Ln) is the effective channel width divided by the effective channel length of the NMOS devices (Mn1, Mn2); Ip is the drain current through the PMOS devices (Mp1, Mp2) and In is the drain current through the NMOS devices (Mn1, Mn2).

First, the PMOS and NMOS input pairs are used with geometries scaled so that the nominal transconductance values are the same (i.e. $gm_{ninput}$ is approx. equal to $gm_{pinput}$). When only one of the differential pairs is active (either the PMOS pair or NMOS pair), the gain will be determined by the transconductance of each of the differential pairs that operates. At around mid-rail region where both differential pairs operate, the transconductance of both of the differential pairs ($gm_{ninput}$ and $gm_{pinput}$) will be reduced so that the overall transconductance remains the same as compared to when only one pair (either PMOS or NMOS) is on.

What is unique here is the usage of Rb1 and Rb2 in series with the tail currents of both PMOS and NMOS input pairs, respectively, to force Mb1 and Mb2 to operate in the triode region when both PMOS and NMOS differential pairs are active. Notably, resistor Rb1 is connected in series between the sources of the PMOS transistor pair Mp1/Mp2 and the drain of the current source transistor, identified by the gate vp1. Likewise, resistor Rb2 is connected in series between the sources of the NMOS transistor pair Mn1/Mn2 and the drain of the current source transistor, identified by the gate vn2. This reduces the tail currents of both stages forcing the current sources into the linear region, thereby reducing the transconductance of both PMOS and NMOS pairs to achieve an overall near constant transconductance. Also, since the tail current is not changed when only one input differential pair is active (as compared to four-fold current increase in the tail current in the prior art), the maximum slewing current remains almost constant. More significantly, this technique does not require extra power consumption. The inputs of a first and a second current source are coupled to the drains of Mn1 and Mn2, respectively, and their outputs are coupled to inb and ina, respectively, to supply the summing current from the NMOS input pair.

One limitation of the above technique is that although the gm is well controlled over the entire common mode input range, the voltage gain varies with Process, Supply Voltage and Temperature (PVT). Since the voltage gain of the above preamplifier can be approximated by $gm_T$*Rout where Rout varies by +/-10% alone and $gm_T$ varies with parameter variations (such as fast/fast, slow/slow and temperature corners) the voltage gain varies a lot. This however, is a common problem with amplifiers operating in open loop.

Figure 3A:
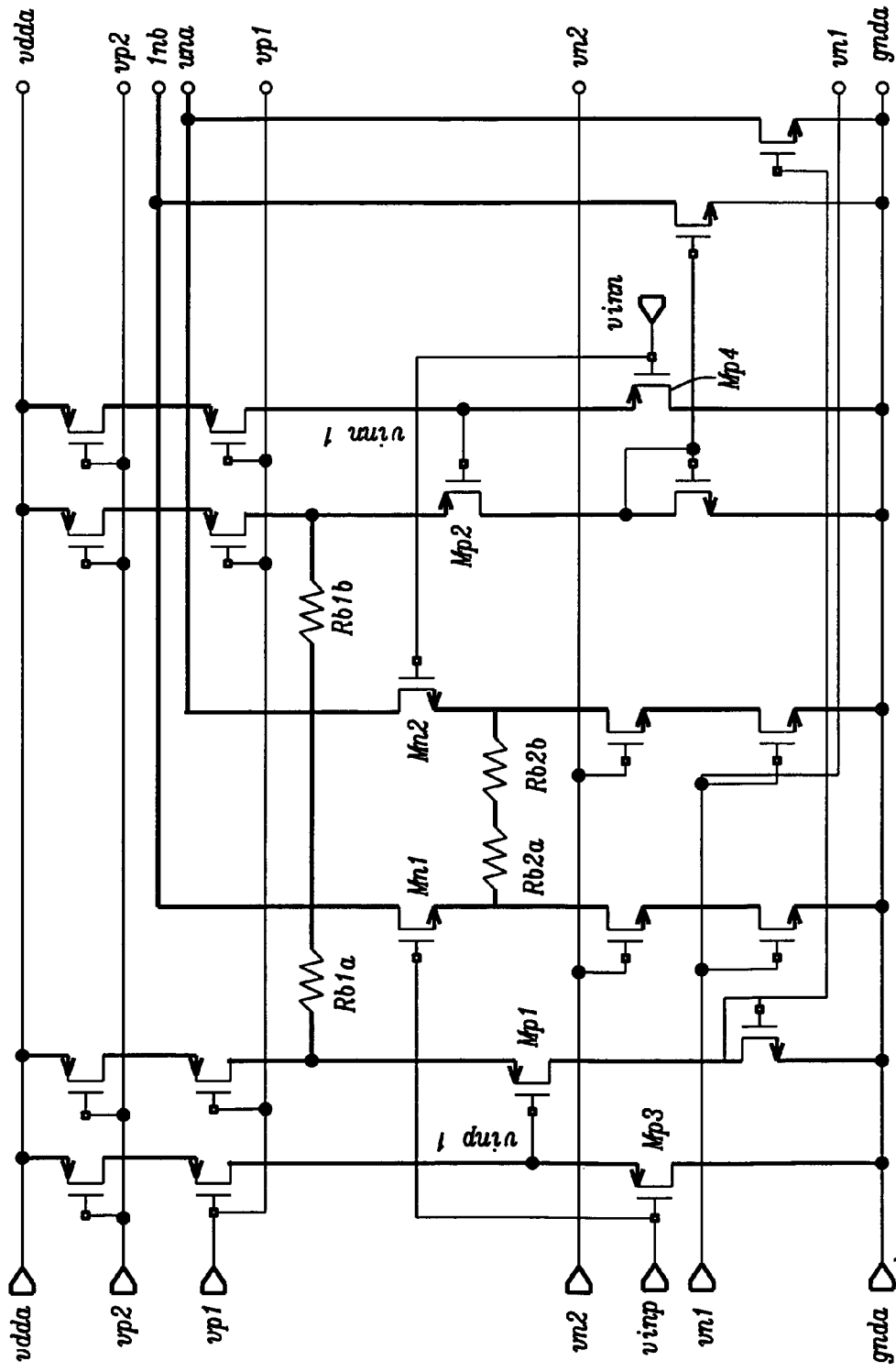
FIGS. 3a and 3b together are a circuit diagram of an LVDS Receiver preamplifier of a second preferred embodiment of the present invention.
Figure 3B:
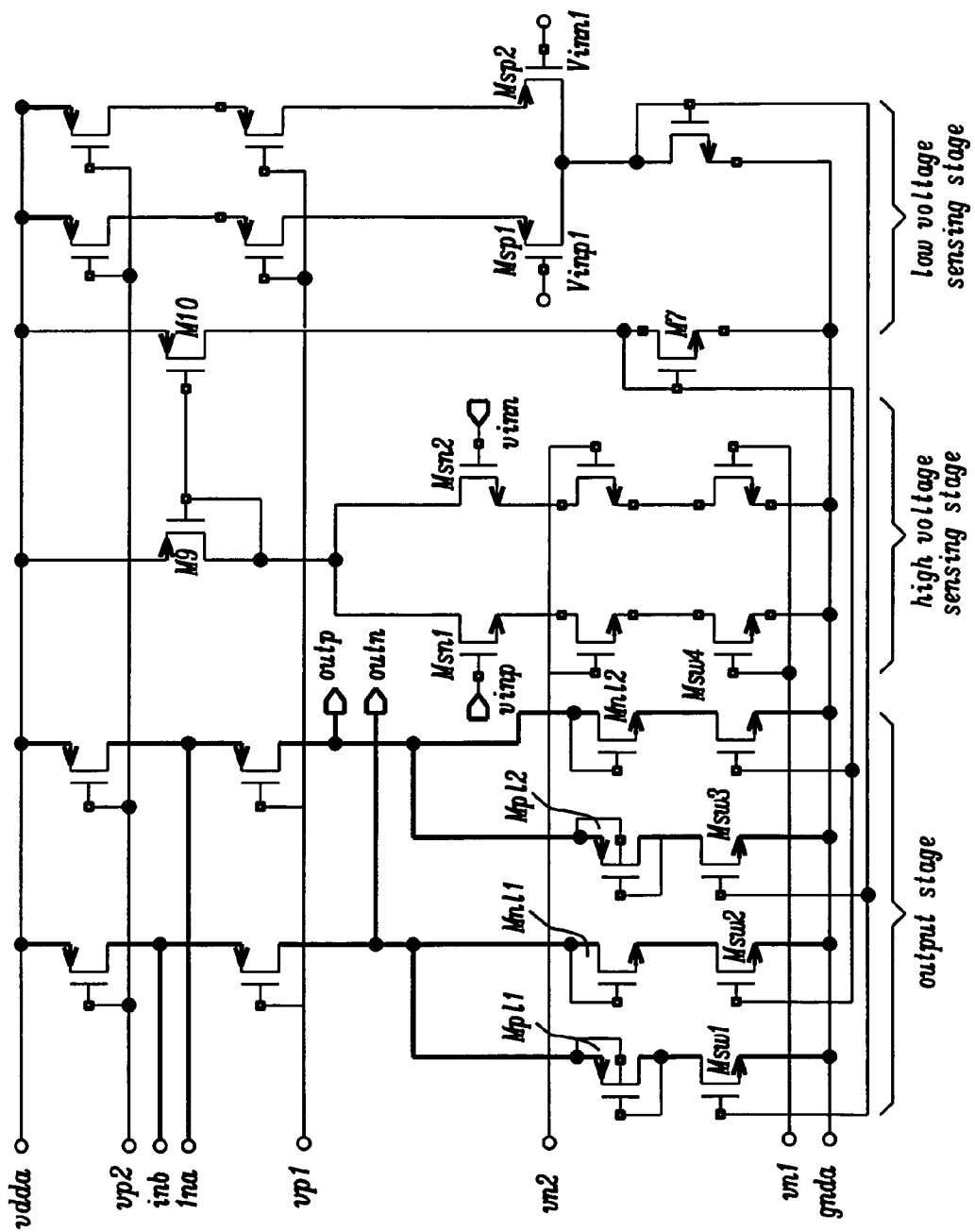
Figure 5:
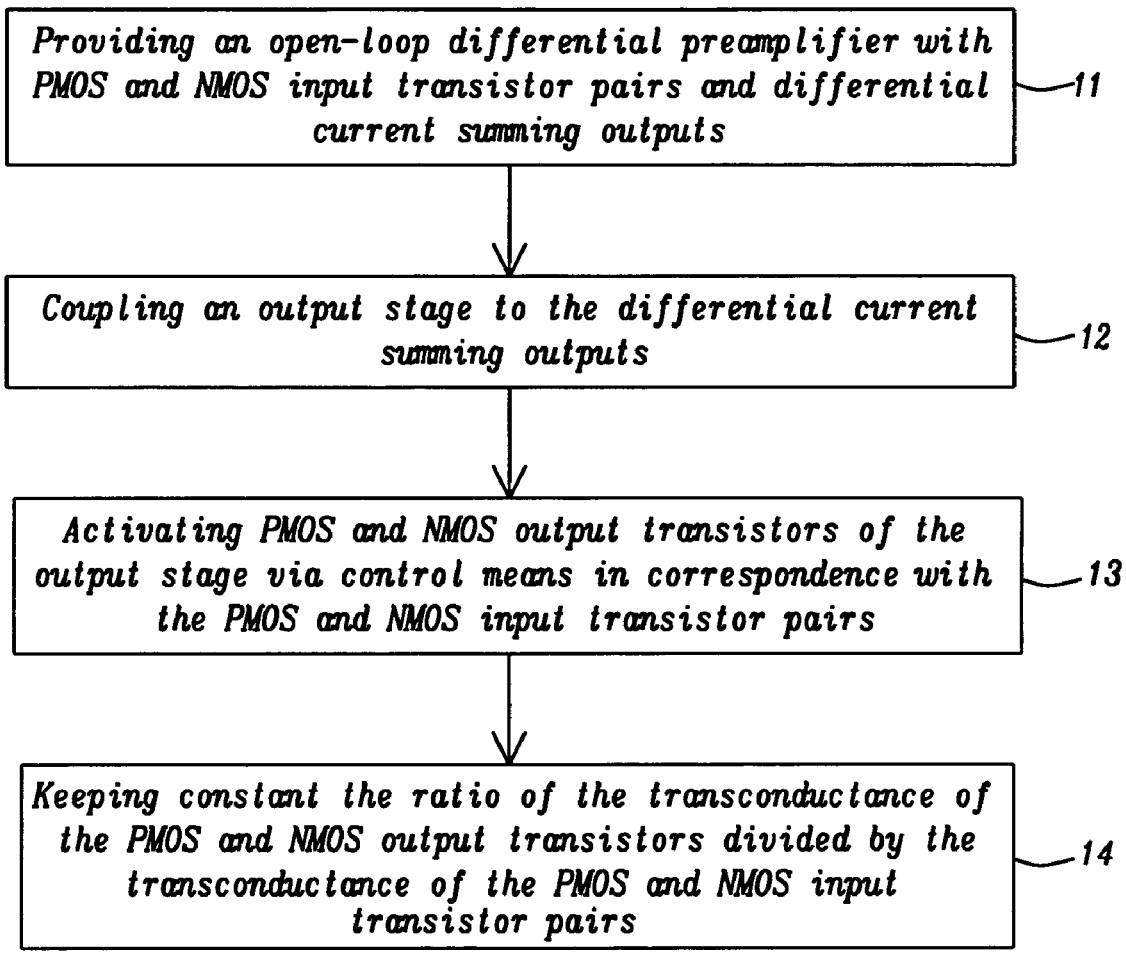
FIG. 5 is a block diagram of the method of the second embodiment of the invention.

Referring now to FIGS. 3a and 3b we describe a second preferred embodiment of the present invention. FIGS. 3a and 3b comprise the entire LVDS Receiver Preamplifier, where FIG. 3a illustrates the differential amplifier section and FIG. 3b illustrates the output stage and the high and low voltage sensing stages. This is a superior implementation of the LVDS Receiver Preamplifier with respect to the first preferred embodiment with almost constant voltage gain over the entire common mode input range. This design is also based on the folded cascode architecture for high frequency operation. The current summation of the PMOS and NMOS pairs is done at node ina and node inb. What is unique here is the usage of diode-connected PMOS (Mpl1, Mpl2) (FIG. 3b) and NMOS (Mnl1, Mnl2) (FIG. 3b) devices as the load. The differential inputs to the LVDS Receiver Preamplifier are vinp and vinn (FIG. 3a) driving the gates of Mp3, Mp4, Mn1, Mn2 (FIG. 3a); the differential outputs are voutp and voutn (FIG. 3b). The inputs to Mp1 and Mp2 are vinp1 and vinn1 which are the outputs of Mp3 and Mp4, respectively. Other inputs to FIGS. 3a and 3b are vdda (the positive rail or positive terminal of a power supply), gnda (the negative rail or negative terminal of a power supply), and biasing inputs vp1, vp2, vn1, and vn2. In addition, FIG. 3b receives nodes ina and inb from FIG. 3a. Other inputs to FIG. 3b are the differential inputs vinp, vinn and vinp1, vinn1, which are discussed below in the disclosure. The operation of this preamplifier is also divided into 3 regions with respect to the input common mode voltage range:

Region 1

When the common mode input voltage range is near the negative power supply, only the PMOS input pair (Mp1, Mp2, FIG. 3a) operates. The PMOS input pair is level shifted via PMOS transistors Mp3, Mp4 so that Mp1 and Mp2 will still operate in saturation region when the common mode input voltage is very low. A circuit branch comprising of Msp1 and Msp2 (FIG. 3b), and receiving inputs vinp1 and vinn1, performs low common mode input voltage sensing and in turn controls Msw1 and Msw3 (FIG. 3b) to activate diode-connected Mpl1 and Mpl2 (FIG. 3b) at the differential outputs. The effective voltage gain at this region will be approximately $gm_{pinput}*(1/gm_{pload})$, where $gm_{pinput}$ is the transconductance of each of the input PMOS device (Mp1, Mp2) and $gm_{pload}$ is the transconductance of the diode-connected PMOS load (Mpl1, Mpl2). Thus, the voltage gain only depends on the W/L ratio of the PMOS input (Mp1, Mp2) divided by the W/L ratio of the PMOS load (Mpl1, Mpl2) at frequencies below the unity gain bandwidth.

Region 2

When the common mode input voltage range is near the positive power supply, only the NMOS input pair Mn1, Mn2 operates. Another circuit branch comprising of Msn1 and Msn2 (FIG. 3b), and receiving inputs vinp and vinn, performs high common mode input voltage sensing and in turn controls Msw2 and Msw4 via M9, M10, M7 (all FIG. 3b) to activate diode-connected Mnl1 and Mnl2 at the differential outputs. The effective voltage gain at this region will be approximately $gm_{ninput}*(1/gm_{nload})$, where $gm_{ninput}$ is the transconductance of each of the input NMOS device (Mn1, Mn2) and $gm_{nload}$ is the transconductance of the diode-connected NMOS load (Mnl1, Mnl2). Thus, the voltage gain only depends on the W/L ratio of the NMOS input (Mn1, Mn2) divided by the W/L ratio of the NMOS load (Mnl1, Mnl2) at frequencies below the unity gain bandwidth.

Region 3

When the common mode voltage is at mid-rail, both differential (PMOS/NMOS) input pairs operate. Both the high and low common mode input sensing circuitry activates, resulting in Mpl1 in parallel with Mnl1 at the voutn terminal and Mpl2 in parallel with Mnl2 at the voutp terminal. The effective voltage gain at this region will be proportional to $(gm_{ninput}+gm_{pinput})*(1/gm_{pload}//1/gm_{nload})$ which equates to $(gm_{ninput}+gm_{pinput})/(gm_{pload}+gm_{nload})$. Since the PMOS and NMOS input pairs are used with geometries scaled so that the nominal transconductance values are the same and this also applies to the PMOS and NMOS load combination, the voltage gain also depends on the W/L ratio of the input CMOS devices (Mp1, Mp2, Mn1, Mn2) divided by the W/L ratio of the CMOS load devices (Mpl1, Mpl2, Mnl1, Mnl2) at frequencies below the unity gain bandwidth.

Therefore, this invention achieves almost constant voltage gain over the entire common mode input range. Although this invention does not focus on maintaining a constant transconductance over the entire common mode input range, its unity gain bandwidth does not vary much. Unity gain bandwidth is proportional to the gm divided by the load capacitance. So the reason for the constant unity gain bandwidth is that at mid-rail where gm doubles, the load capacitance also increases as much since both PMOS and NMOS load combinations are activated. In a third preferred embodiment of the present invention optional small values of Rb1a, Rb1b, Rb2a and Rb2b (FIG. 3a) can be included in the design to improve the linearity of the transconductance of the NMOS input pair (Rb2a & Rb2b) and PMOS input pair (Rb1a & Rb1b) if needed.

Another advantage of this unique load combination is that its DC operating point will perfectly bias the next amplifier stage with an NMOS input pair. This is because this DC bias point will increase if the $V_T$ of the NMOS transistors is higher, thereby providing the increased $V_{GS}$ voltage to the NMOS input pair at the next stage to maintain a constant NMOS gate bias voltage above threshold ($V_{GS}-V_T$). Therefore, this tracking mechanism ensures that the preamplifier performance characteristics is well maintained over process, supply voltage, temperature (PVT) corners.

We now describe a first preferred method of maintaining a constant voltage gain over a large common mode input voltage range for a high frequency receiver preamplifier with rail-to-rail capability:

Block 1: providing an open-loop differential preamplifier where PMOS and NMOS input transistor pairs are scaled to have the same transconductance;

Block 2: inserting resistive means into the tail current paths of each of the PMOS and NMOS input transistor pairs, between their sources and the transistor drains of their respective current sources, thereby forcing current sources in their tail current paths into the triode region of operation;

Block 3: reducing thereby the total transconductance of both the PMOS and NMOS input transistor pairs, when active, to that of one active input transistor pair;

Block 4: keeping thereby the transconductance of the open-loop differential preamplifier constant regardless of the common mode input voltage;

Block 5: coupling current summing outputs to the drains of the PMOS and NMOS transistor pair.

A constant transconductance across the common mode input voltage range guarantees the desired constant gain.

The second preferred method of maintaining a constant voltage gain over a large common mode input voltage range for a high frequency receiver preamplifier with rail-to-rail capability is:

Block 11: providing an open-loop differential preamplifier with PMOS and NMOS input transistor pairs and differential current summing outputs;

Block 12: coupling an output stage to the differential current summing outputs;

Block 13: activating PMOS and NMOS output transistors of the output stage via control means in correspondence with the PMOS and NMOS input transistor pairs;

Block 14: keeping constant the ratio of the transconductance of the PMOS and NMOS output transistors divided by the transconductance of the PMOS and NMOS input transistor pairs.

In a third preferred method, in addition to the steps of Blocks 11 to 14, resistive means are coupled between the sources of the PMOS and NMOS input transistors pairs, respectively, to improve the linearity of the transconductance of the PMOS and NMOS input transistors pairs.

While the invention has been particularly shown and described with reference to the preferred embodiments thereof, it will be understood by those skilled in the art that various changes in form and details may be made without departing from the spirit and scope of the invention.

What is claimed is:

1. A folded cascode preamplifier, comprising:
an open-loop high frequency differential amplifier with PMOS and NMOS transistor pairs coupled to differential inputs, where first and second resistive means are connected in series between drains of transistors of first and second current sources and the sources of each of said PMOS and NMOS transistor pairs, respectively, to force transistors of said first and second current sources into the triode region of their operation thus reducing the tail current of both PMOS and NMOS transistor pairs when active at the same time, such that when either PMOS and NMOS transistor pair is active, the overall transconductance is the same as when both PMOS and NMOS transistor pairs are active, independent of the common mode input voltage applied to said differential inputs, where the drains of both PMOS and NMOS transistor pairs are in communication with differential summing outputs; and
an output stage coupled to said differential summing outputs to amplify the currents summed at said differential summing outputs.

2. The folded cascode preamplifier of claim 1, wherein said sources of said PMOS differential input pair in series with said first resistive means and said first current source are in communication with a positive terminal of a power supply.

3. The folded cascode preamplifier of claim 1, wherein said sources of said NMOS differential input pair in series with said second resistive means and said second current source are in communication with a negative terminal of a power supply.

4. The folded cascode preamplifier of claim 1, wherein PMOS and NMOS transistors of said PMOS and NMOS differential input pairs are scaled such that the transconductance of said PMOS and NMOS transistor is the same when active.

5. The folded cascode preamplifier of claim 1, wherein said differential summing outputs sum the currents of said PMOS and NMOS differential input pairs.

6. The folded cascode preamplifier of claim 1, wherein a low common mode input voltage activates said PMOS transistor pair.

7. The folded cascode preamplifier of claim 1, wherein a high common mode input voltage, activates said NMOS transistor pair.

8. The folded cascode preamplifier of claim 1, wherein a common mode input voltage ranging between a low and a high common mode voltage activates both said PMOS and said NMOS transistor pairs.

9. A folded cascode preamplifier, comprising:
an open-loop high frequency differential amplifier having differential inputs and differential current summing outputs, said open-loop differential amplifier having constant transconductance, and thus constant gain and constant maximum slewing current, over a large common mode input voltage range whereby at a low common mode input voltage when only PMOS transistors are active and at a high common mode input voltage when only NMOS transistors are active both said PMOS and said NMOS transistors have the same transconductance, and at a middle input common mode voltage, between said low and said high input voltage when both PMOS and NMOS transistors are active their transconductances are reduced such that their combined transconductance is equal to the individual transconductance of said PMOS and NMOS transistors, said open-loop high frequency differential amplifier further comprising:
at least a PMOS differential input pair of transistors, where the gates of said PMOS differential input pair are coupled to said differential inputs, respectively, the sources of said PMOS differential input pair connected together and having a common tail current further connected in series with a first resistive means and a drain of a transistor of a first current source a source of said first current source coupled to a positive power supply, and where the drains of said PMOS differential input pair are coupled to said differential summing outputs, respectively;
at least an NMOS differential input pair of transistors, where the gates of said NMOS differential input pair are coupled to said differential inputs, respectively, the sources of said NMOS differential input pair connected together and having a common tail current further connected in series with a second resistive means and a drain of a transistor of a second current source a source of said second current source coupled to a negative power supply, and where the drains of said NMOS differential input pair are coupled via current sources to said differential summing outputs, respectively, and where said current sources supply summing currents derived from said NMOS differential input pair; and
an output stage coupled to said differential summing outputs and having differential outputs, said output stage comprising two cascoded current sources in parallel, where said differential summing outputs are coupled to the junction of said cascaded current sources, respectively.

10. The folded cascode preamplifier of claim 9, wherein said first and said second resistive means reduces the transconductance of said PMOS and said NMOS differential input pairs when both are active.

11. The folded cascode preamplifier of claim 9, wherein said PMOS and NMOS transistors are scaled such that the transconductance of said PMOS and NMOS transistors is the same when active.

12. The folded cascode preamplifier of claim 9, wherein said lower common mode input voltage ranges from said negative power supply up.

13. The folded cascode preamplifier of claim 9, wherein said upper common mode input voltage ranges from said positive power supply down.

14. The folded cascode preamplifier of claim 9, wherein said first and said second current source is coupled between a positive power supply and the drains of said NMOS differential input pair, respectively.

15. The folded cascode preamplifier of claim 14, wherein current mirrors, controlled by said current sources, are coupled between said positive power supply and said differential summing outputs, respectively.

16. A folded cascode preamplifier, comprising:
an open-loop high frequency differential amplifier having differential inputs and differential current summing outputs, said open-loop differential amplifier having constant transconductance, and thus constant gain and constant maximum slewing current, over a large common mode input voltage range whereby at a low common mode input voltage when only PMOS transistors are active and at a high common mode input voltage when only NMOS transistors are active both said PMOS and said NMOS transistors have the same transconductance, and at a middle input common mode voltage, between said low and said high input voltage when both PMOS and NMOS transistors are active their transconductances are reduced such that their combined transconductance is equal to the individual transconductance of said PMOS and NMOS transistors, said open-loop high frequency differential amplifier further comprising:
 a first and a second PMOS transistor together comprising a PMOS differential input pair, where the gates of said first and said second PMOS transistor are coupled to the first and second terminal of said differential inputs, respectively, the sources of said PMOS differential input pair connected together and having a common tail current further connected in series with a first resistive means and a drain of a transistor of a first current source, a source of said first current source coupled to the terminal of a positive power supply, and where the drains of said first and said second PMOS transistor are coupled to first and second nodes of said differential summing outputs, respectively, to supply a summing current;
 a first and a second NMOS transistor together comprising an NMOS differential input pair, where the gates of said first and said second NMOS transistor are coupled to said first and second terminal of said differential inputs, respectively, the sources of said NMOS differential input pair connected together and having a common tail current, further connected in series with a second resistive means and a drain of a transistor of a second current source, a source of said second current source coupled to the terminal of a negative power supply, and where the drains of said first and said second NMOS transistor are coupled via a third and a fourth current source to the positive terminal of said power supply, respectively;
 first and second current mirrors coupled to said positive power supply, their inputs coupled to the drains of said NMOS differential input pair, respectively, the outputs of said first and second current mirror coupled to said second and said first node of said differential summing outputs, respectively, said first and second current mirror supplying a summing current derived from said NMOS differential input pair; and
an output stage coupled to said differential summing outputs, said output stage producing an amplified signal at differential outputs, said output stage comprising a first cascoded current source in series with first resistive means coupled between the positive and a negative terminals of a power supply, and a second cascoded current source in series with second resistive means coupled between the positive and the negative terminals of said power supply, where said differential summing outputs are coupled to the junction of said first and said second cascoded current source, respectively, and where said differential outputs of said output stage are coupled between said first and said second resistive means and said first and said second cascoded current source, respectively.

17. The folded cascode preamplifier of claim 16, wherein said first and said second resistive means of said PMOS and said NMOS differential input pairs reduces the transconductance of said PMOS and said NMOS differential input pairs, respectively, when both are active.

18. The folded cascode preamplifier of claim 16, wherein said PMOS and NMOS transistors are scaled such that the transconductance of said PMOS and NMOS transistors is the same when active.

19. The folded cascode preamplifier of claim 16, wherein said lower common mode input voltage ranges from said negative power supply up.

20. The folded cascode preamplifier of claim 16, wherein said upper common mode input voltage ranges from said positive power supply down.

21. The folded cascode preamplifier of claim 16, wherein the PMOS and NMOS transistors of said PMOS and NMOS differential input pairs are scaled such that the transconductance of said PMOS and NMOS transistor is the same when active.

22. The folded cascode preamplifier of claim 16, wherein the PMOS and NMOS transistors of said output stage are scaled such that the transconductance of said PMOS and NMOS transistor is the same when active.

23. The method of maintaining a constant voltage gain over a large common mode input voltage range for a high frequency receiver preamplifier with rail-to-rail capability, comprising the steps of:
 a) providing an open-loop differential preamplifier where PMOS and NMOS input transistor pairs are scaled to have the same transconductance;
 b) connecting resistive means into the tail current paths of each of said PMOS and NMOS input transistor pairs, between their sources and the transistor drains of their respective current sources, thereby forcing current sources in their tail current paths into the triode region of operation;
 c) reducing thereby the total transconductance of both said PMOS and NMOS input transistor pairs, when active, to that of one active input transistor pair;
 d) keeping thereby constant the transconductance and the maximum slewing current of said open-loop differential preamplifier regardless of the common mode input voltage;
 e) coupling current summing outputs to the drains of said PMOS transistor pair;
 f) coupling said current summing outputs to the drains of said NMOS transistor pair via current sources; and
 g) coupling an output stage with differential outputs to said current summing outputs to amplify the currents at said current summing outputs.

* * * * *

UNITED STATES PATENT AND TRADEMARK OFFICE
CERTIFICATE OF CORRECTION

PATENT NO. : 7,777,568 B2  Page 1 of 1
APPLICATION NO. : 11/002616
DATED : August 17, 2010
INVENTOR(S) : Hong Sair Lim It is certified that error appears in the above-identified patent and that said Letters Patent is hereby corrected as shown below:

Title Page,
In the ASSIGNEE: (73), delete "Mandate Chips and Circuits Pvt. Ltd., Singapore (SG)", and replace with -- Intelligent Design Limited, Ebene, Mauritius --.

Signed and Sealed this
Third Day of May, 2011

David J. Kappos
*Director of the United States Patent and Trademark Office*